United States Patent [19]

Bogenschütz et al.

[11] Patent Number: 4,812,202

[45] Date of Patent: Mar. 14, 1989

[54] PROCESS FOR METAL-PLATING CERAMIC SURFACES

[75] Inventors: August F. Bogenschütz, Oberdischingen; Josef L. Jostan; Robert Ostwald, both of Ulm, all of Fed. Rep. of Germany

[73] Assignee: Licentia Patent-Verwaltungs-GmbH, Frankfurt am Main, Fed. Rep. of Germany

[21] Appl. No.: 885,254

[22] Filed: Jul. 7, 1986

[30] Foreign Application Priority Data

Jul. 4, 1985 [DE] Fed. Rep. of Germany ....... 3523957

[51] Int. Cl.$^4$ .............................................. B44C 1/22
[52] U.S. Cl. .................................... 156/628; 156/635; 156/662; 156/663; 252/79.4; 252/79.5
[58] Field of Search ............... 156/635, 662, 663, 626, 156/645, 667, 628; 427/309; 252/79.4, 79.5

[56] References Cited

U.S. PATENT DOCUMENTS

| 3,607,473 | 9/1971 | Grunwald | 156/635 |
| 3,770,528 | 11/1973 | Hermes | 156/626 |
| 4,428,986 | 1/1984 | Schachameyer | 156/633 |
| 4,647,477 | 3/1987 | DeLuca | 156/667 |
| 4,721,549 | 1/1988 | Bogenschutz et al. | 156/633 |

FOREIGN PATENT DOCUMENTS 0035626 9/1981 European Pat. Off. .
0128476 12/1984 European Pat. Off. .

Primary Examiner—David L. Lacey
Assistant Examiner—Lori-Ann Johnson
Attorney, Agent, or Firm—Spencer & Frank

[57] ABSTRACT

The present invention relates to a process for wet metal-plating of ceramic substrates. More particularly this invention relates to the wet chemical copper plating of $Al_2O_3$ ceramics. It is essentially composed of a combined chemical pretreatment of the ceramic surface for chemical metallization without external electric current in such a manner that within only a single pretreatment step the substrate surface is chemically activated and is simultaneously covered with an adhesion promoter, and/or a sensitizer and/or an activator (catalyst).

23 Claims, No Drawings

PROCESS FOR METAL-PLATING CERAMIC SURFACES

FIELD OF THE INVENTION

The present invention relates to a process for metal-plating ceramic substrates. This process is particularly useful for the wet chemical plating of copper onto aluminum oxide ceramics.

DESCRIPTION OF THE BACKGROUND

It is known, for example, that highly pure aluminum oxide ceramics, for various electrical and electronic applications, are advantageously pretreated with an alkali solution or melt to improve their wettability and adhesion. In such a process, the surface of the ceramic material is disrupted, chemically inert surface regions are removed and a chemically active surface is produced. In addition, the surface is more or less roughened during this process so that mechanical anchoring is made possible, thereby permitting increased adhesion of the metal coating.

If surface roughening is not desirable, e.g., for electrical applications, an adhesion promoter is used. One such promoter is $Cu_2O$ as disclosed in DE 2,533,524. Another promoter is silicic acid according to DE 2,004,133. Both these promoters are capable of reacting with a ceramic surface and simultaneously forming bonds with a copper layer.

It is also known to cover a ceramic surface by immersing the substrate in sensitizing and/or activating solutions with the use of, e.g., Sn/Pd catalyst nuclei, and subsequently covering the surface with copper by means of chemical deposition from copper baths which are commercially available. The steps of the known process are, in general, separate steps which are performed in succession. This process, however, is uneconomical, particularly for industrial mass production.

Thus, there is a need for an improved process of this type, whereby by combining various process steps into one, high adhesion of the applied metal layer and an economical as well as reliable manufacturing process is attained, which is particularly useful for industrial mass production.

SUMMARY OF THE INVENTION

In one aspect of this invention, we have provided an improvement over known treatments comprising a sequence of treatments applied to a ceramic substrate to improve its characteristics prior to metal-plating thereof. The novel process comprises a single step conducted prior to metal-plating, whereby cleaning, roughening, chemically activating and precoating the ceramic surface are simultaneously effected by immersing said ceramic substrate in a single pretreatment bath including an alkaline or acidic pretreatment medium prior to metal coating; the bath further comprising an agent selected from the group consisting of an adhesion promoter, a sensitizer, an activator, a catalyst and precursors thereof. The pretreatment step is conducted at a temperature higher than ambient temperature in the absence of an external electric current.

In another aspect of this invention, the pretreatment medium is a melt or a solution.

In still another aspect of this invention, is provided a process whereby a ceramic substrate is immersed in an alkaline melt at a temperature between about 100° C. and 1000° C., more preferably between about 150° C. and 600° C.

In yet another aspect, it is herein provided that the substrate is immersed in an acid melt at a temperature between about 100° C. and 1200° C.

In yet another aspect, is provided a process wherein the substrate is immersed in a pretreatment medium which is an acidic solution at between about 15° C. and 300° C.

DESCRIPTION OF THE INVENTION

In accordance with the present invention, only a single pretreatment step is required prior to metal-plating a ceramic substrate, such as copper-plating. For one aspect of this invention, an adhesion promoter (or its precursor) and/or a sensitizer (or its precursor) and/or an activator such as a catalyst (or its precursor) are added to the alkali or acid pretreatment medium. The pretreatment medium may be in the form of a solution or melt, as required for different purposes.

Suitable adhesion promoters are compounds of the elements of Groups III to VI and/or Subgroups I to VIII of the Periodic Table of Elements. Adhesion promoters which can be used with the present process are silicates, molybdates, tungstates, vanadates, titanates, stannates, cuprates, manganates and ferrates, among others, in their different oxidation stages. However, other adhesion promoters can also be used.

The oxides corresponding to these compounds are capable of forming alumosilicates, spinels, and the like, such as $M^{II}M2^{III}O_4$, $M2^{I}M2^{III}O_4$ and other mixed oxides, with the ceramic components onto which they are adhered, particularly when heated. The terms $M^{I}$, $M^{II}$ and $M^{III}$ represent herein mono-, di and tri-valent elements of the stated groups.

An alkali stannate(II) solution may also be added as a sensitizing additive. Also, tin(II) oxide or tin(II) hydroxide can be added to the alkali hydroxide melt. Since these are strongly reducing media, $Pd^{2+}$ ions provided during the subsequent process sequence can be reduced to $Pd^0$ nuclei. The $Pd^0$ nuclei are themselves known to catalyze the chemical copper deposition in the absence of an external electric current. On the other hand, media containing tin(II) gradually become ineffective due to the presence of oxygen in the air. Thus, it is advisable to use these media in an atmosphere of inert gas.

As an alternative, $Pd^0$- or $Pt^0$- forming activators can advantageously be added to the alkali medium as precursors. Suitable compounds are, for example, water containing palladium or platinum oxides. These oxides, when exposed to strong alkali, and particularly when heated, are converted to the corresponding hydroxide complexes, e.g., according to the formula

$$PtO_2 . 2\, H_2O + 2\, OH^- \rightarrow Pt(OH)_6^{2-}$$

When the ceramic body is immersed in such pretreatment medium, the metal hydroxide becomes absorbed within its surface. During subsequent immersion in a reducing solution of, e.g., $SnCl_2/HCl$, hypophosphite/NaOH or boranates, aminoboranes or hydrazine compounds, metallic $Pt^0$ or $Pd^0$ nuclei are formed.

A direct addition of an activator in the form of platinum or palladium metal colloids is also possible. The resulting colloidal particles are then anchored in the microroughened surface of the ceramic body (substrate).

If copper is to be used as an activator, it is advantageous to start with the respective precursors. Thereafter, the hydroxide $Cu(OH)_2$ is added to the melt. Copper hydroxide is easily soluble in NaOH, and, during the subsequent reduction treatment, can be reduced on the substrate surface. Depending on the desired use, copper hydroxide can be reduced, e.g., with glucose, to $Cu_2O$ (adhesion promoter) or with formaldehyde to $Cu^0$ (activator nucleus). In the latter case, Ag nuclei, which are added as AgOH in low concentration to the $Cu(OH)_2$ and are reduced to $Ag^0$, have an activity-increasing effect.

In an analogous manner to the pretreatment of ceramics with an alkali medium, and in another aspect of the invention, is provided a process according to the invention by means of an acid pretreatment of certain types of ceramics, e.g. barium titanate ceramics. For example, tin(II) sulfate can be added as a sensitizer to the molten $KHSO_4$ or $NH_4HSO_4$ pretreatment medium to then be transformed during the subsequent hydrolysis to $Sn(OH)_2$.

Melts containing hydrofluoric acid or fluorides, or concentrated solutions thereof can advantageously be mixed with $SnF_2$ which, after a hydrolysis process, likewise forms $Sn(OH)_2$, and is suitable as sensitizer for the reduction of $Pd^{2+}$ or $Ag^+$.

Silver nuclei can be produced, in a similar manner, directly on the substrate surface by the reduction of added AgF with, for example, formaldehyde.

The following examples are included for illustrative purposes only, and are not meant to limit the scope of the invention or the claims.

EXAMPLES

Example 1

For the simultaneous pretreatment by surface cleansing, microroughening and coating with an adhesion promotor, a highly pure $Al_2O_3$ ceramic (99.6 % $Al_2O_3$) is immersed into a sodium hydroxide melt containing 0.01 to 10 g/l, preferably 0.5 g/l sodium silicate, which was added as the stoichiometric quantity of highly dispersed silicic acid (e.g. in the form of Aerosil 2000 produced by Degussa, Frankfurt). The temperature of the melt is 350° C.

Depending on the desired degree of roughening, the duration of the treatment is 1 to 10 minutes, preferably 6 minutes. Thereafter, the ceramic piece is rinsed in water, activated in a known manner with $SnCl_2/PdCl_2$, copper is chemically deposited to a thickness of 0.5 μm in the absence of an external electric current, then the piece is heated for 10 minutes at 450° C. in a nitrogen atmosphere and then more copper is galvanically chemically deposited in the absence of electric current.

The adhesion of a 10 to 15 μm copper layer, measured in a vertical peel test is more than 25 N/mm², thus exceeding the breaking strength of the ceramic material.

Example 2

The procedure is the same as in Example 1. The difference herein being that 0.01 to 10 g/l, preferably 0.3 g/l, freshly precipitated tin(II) hydroxide are added to the sodium hydroxide melt under a nitrogen atmosphere instead of silicic acid. The precipitation was effected immediately prior to this step by reacting $SnCl_2$ in a weak hydrochloric acid solution with a NaOH solution under a nitrogen atmosphere. Stirring finely distributes the tin(II) hydroxide in the melt until it has completely dissolved.

The $Al_2O_3$ ceramic pieces are treated in the melt for 1 to 19 minutes, preferably for 8 minutes, at 450° C., are then briefly rinsed in water, are dipped for activation into a weakly hydrofluoric acid/$PdCl_2$ solution containing 0.5 g/l $PdCl_2$ and are then copper plated in a currentless chemical manner. Due to the more intensive surface roughening of the ceramic material, the only subsequent thermal treatment required to impart sufficiently high adhesion to the subsequently applied copper coating is a treatment at 150° C. for 15 minutes.

Example 3

The procedure is the same as in Example 2. The difference herein is that instead of tin(II) hydroxide, Ag activated copper(II) hydroxide is used in the melt at a concentration of 0.01 to 10 g/l, preferably 0.8 g/l. The preparation was freshly produced by precipitation from a copper(II) nitrate solution with diluted sodium hydroxide solution, with some silver nitrate (in a weight ratio of Cu : Ag of 100 : 1) being added to the copper(II) nitrate solution. After immersing of the ceramic pieces into the melt, the latter are prerinsed for 1 minute in a solution of 2 g/l $SnCl_2$, 10 g/l 35% formaldehyde and sodium hydroxide solution until a pH=10 is reached and are then rinsed with water until the latter runs clear. The subsequent copper plating takes place as described in Example 2.

Example 4

This procedure is the same of Example 1. The difference resides in the addition to the silicic acid, a palladium colloid (palladium black) is very finely dispersed in the NaOH melt at a concentration of 1 g/l. It is advisable that the introduction of Pd into the melt takes place in such a form that the palladium colloid is separately mixed with the molten sodium hydroxide in a small gold crucible, and then added to the rest of the melt with stirring. After immersing the ceramic pieces in the melt and a brief intermediate rinsing in water, the pieces can be directly subjected to chemical copper plating and then subjected to further thermal treatment.

Example 5

Barium titanate ceramic substrates are pretreated in a melt of ammonium hydrogen sulfate to which is added 10 weight % tin(II) acetate. The duration of the treatment at a temperature of 200° C. is about 10 minutes. After rinsing with water, the substrate surface is covered with Pd nuclei by immersing the substrate in a hydrochloric acid solution containing 0.5 g/l $PdCl_2.2H_2O$. Then the pieces are chemically copper-plated in the absence of an electrical current, and then galvanically reinforced. The adhesion of the copper coating exceeds the breaking strength of the ceramic material.

The present disclosure relates to the subject matter disclosed in application No. P 3523957.3, filed in the Federal Republic of Germany on July 4th, 1985, the entire specification of which is incorporated herein by reference.

It is understood that various other modifications will be apparent to and can readily be made by those skilled in the art without departing from the scope and spirit of this invention. Accordingly, it is not intended that the scope of the claims appended hereto be limited to the description as set forth above, but rather that all claims be construed as encompassing all the features of patentable novelty which reside in the present invention, including all features which would be treated as equivalents thereof by those skilled in the art to which this invention pertains.

We claim:

1. A process for treating a ceramic substrate preparatory to wet metal-plating, the process comprising the steps of:
providing a single pretreatment bath comprised of a pretreatment medium and at least one precoating agent, said pretreatment medium being selected from the group consisting of an alkaline pretreatment medium and an acidic pretreatment medium, and serving to clean, roughen and chemically activate the ceramic surface, and said at least one precoating agent being selected from the group consisting of an adhesion promoter, a sensitizer, an activator, and precursors thereof, and serving to precoat the ceramic surface;
immersing said ceramic substrate in the single pretreatment bath to simultaneously clean, roughen, chemically activate and precoat the ceramic substrate in a single step prior to wet metal-plating, said single step being conducted at a temperature higher than ambient temperature and in the absence of an external electric current;
removing the ceramic substrate from the single pretreatment bath; and
placing the ceramic substrate within a wet metal-plating bath and wet metal-plating said ceramic substrate.

2. The process of claim 1 wherein the substrate is an $Al_2O_3$ ceramic.

3. The process of claim 1 wherein the pretreatment medium is a concentrated alkali solution.

4. The process of claim 3 wherein the alkali solution is a saturated alkali solution.

5. The process of claim 1 wherein the pretreatment medium is an acid solution having a temperature up to about 300° C.

6. The process of claim 5 wherein the acid solution is selected from the group consisting of:
a sulfuric acid solution,
a hydrochloric acid solution,
a hydrofluoric acid solution, and
a phosphorus acid solution.

7. The process of claim 1 wherein the at least one agent is an activator selected from the group consisting of:
chemical metallization catalysts, and
precursors thereof.

8. The process of claim 7 wherein the activator is selected from the group consisting of compounds containing the elements Ni, Cu, Ag, Au, Pd, Pt and the metal elements thereof.

9. The process of claim 1 wherein said at least one precoating agent in the pretreatment medium is:
an adhesion promoter,
a precursor thereof, or
mixtures thereof.

10. The process of claim 9 wherein the adhesion promoter is selected from the group consisting of:
copper oxide,
silicic acid, and
an alkali silicate.

11. The process of claim 9 wherein the adhesion promoter or its precursor is selected from the group consisting of compounds of the elements of Groups III to VI and Subgroups I to VIII of the Periodic Table of Elements and mixtures thereof.

12. The process of claim 11 wherein the adhesion promoter is selected from the group consisting of:
silicates,
molybdates,
tungstates,
vanadates,
titanates,
manganates,
ferrates,
cuprates,
stannates, and
mixtures thereof.

13. The process of claim 1 wherein said at least one precoating in the pretreatment medium is:
a sensitizer,
a precursor, or
a mixture thereof.

14. A process for treating a ceramic substrate preparatory to wet metal-plating, the process comprising the steps of:
providing a single pretreatment bath comprised of a pretreatment medium and at least one precoating agent, said pretreatment medium being an alkaline pretreatment medium, and serving to clean, roughen and chemically activate the ceramic surface, said at least one precoating agent being selected from the group consisting of an adhesion promoter, a sensitizer, an activator, and precursors thereof, and serving to precoat the ceramic surface, and said single pretreatment bath being a melt having a melt temperature between about 100° C. and 1000° C.;
immersing said ceramic substrate in the single pretreatment bath to simultaneously clean, roughen, chemically activate and precoat the ceramic substrate in a single step prior to wet metal-plating, said single step being conducted at a temperature higher than ambient temperature and in the absence of an external electric current;
removing the ceramic substrate from the single pretreatment bath; and
placing the ceramic substrate within a wet metal-plating bath and wet metal-plating said ceramic substrate.

15. The process of claim 14, wherein the alkali melt comprises at least one alkali hydroxide having a temperature between about 150° C. and 600° C.

16. A process for treating a ceramic substrate preparatory to wet metal-plating, the process comprising the steps of:
providing a single pretreatment bath comprised of a pretreatment medium and at least one precoating agent, said pretreatment medium being a concentrated alkali solution comprised of at least one alkali hydroxide, and serving to clean, roughen and chemically activate the ceramic surface, and said at least one precoating agent being selected from the group consisting of an adhesion promoter, a sensitizer, an activator, and precursors thereof, and serving to precoat the ceramic surface;
immersing said ceramic substrate in the single pretreatment bath to simultaneously clean, roughen, chemically activate and precoat the ceramic substrate in a single step prior to wet metal-plating, said single step being conducted at a temperature higher than ambient temperature and in the absence of an external electric current;

removing the ceramic substrate from the single pretreatment bath; and placing the ceramic substrate within a wet metal-plating bath and wet metal-plating said ceramic substrate.

17. A process for treating a ceramic substrate preparatory to wet metal-plating, the process comprising the steps of:

providing a single pretreatment bath comprised of a pretreatment medium and at least one precoating agent, said pretreatment medium being an acidic pretreatment medium, and serving to clean, roughen and chemically activate the ceramic surface, said at least one precoating agent being selected from the group consisting of an adhesion promoter, a sensitizer, an activator, and precursors thereof, and serving to precoat the ceramic surface, and said single pretreatment bath being an acid melt having a melt temperature between about 100° C. and 1200° C. immersing said ceramic substrate in the single pretreatment bath to simultaneously clean, roughen, chemically activate and precoat the ceramic substrate in a single step prior to wet metal-plating, said single step being conducted at a temperature higher than ambient temperature and in the absence of an external electric current;

removing the ceramic substrate from the single pretreatment bath; and placing the ceramic substrate within a wet metal-plating bath and wet metal-plating said ceramic substrate.

18. A process for treating a ceramic substrate preparatory to wet metal-plating, the process comprising the steps of:

providing a single pretreatment bath comprised of a pretreatment medium and at least one precoating agent, said pretreatment medium being selected from the group consisting of an alkaline pretreatment medium and an acidic pretreatment medium, and serving to clean, roughen and chemically activate the ceramic surface, and said at least one precoating agent being a sensitizer which is a tin(II) compound, or a precursor thereof, and serving to precoat the ceramic surface;

immersing said ceramic substrate in the single pretreatment bath to simultaneously clean, roughen, chemically activate and precoat the ceramic substrate in a single step prior to wet metal-plating, said single step being conducted at a temperature higher than ambient temperature and in the absence of an external electric current;

removing the ceramic substrate from the single pretreatment bath; and placing the ceramic substrate within a wet metal-plating bath and wet metal-plating said ceramic substrate.

19. A process for treating a ceramic substrate preparatory to wet metal-plating, the process comprising the steps of:

providing a single pretreatment bath comprised of a pretreatment medium and at least one precoating agent, said pretreatment medium being selected from the group consisting of an alkaline pretreatment medium and an acidic pretreatment medium, and serving to clean, roughen and chemically activate the ceramic surface, and said at least one precoating agent being an activator present as a fine particulate, being selected from the group consisting of chemical metallization catalysts and precursors thereof, which group is selected from compounds containing the elements Ni, Cu, Ag, Au, Pd, Pt and the metal elements thereof, and serving to precoat the ceramic surface;

immersing said ceramic substrate in the single pretreatment bath to simultaneously clean, roughen, chemically activate and precoat the ceramic substrate in a single step prior to wet metal-plating, said single step being conducted at a temperature higher than ambient temperature and in the absence of an external electric current;

removing the ceramic substrate from the single pretreatment bath; and placing the ceramic substrate within a wet metal-plating bath and wet metal-plating said ceramic substrate.

20. The process of claim 19 wherein the fine particulate is in colloidal form.

21. A process for treating a ceramic substrate preparatory to wet metal-plating, the process comprising the steps of:

providing a single pretreatment bath comprised of a pretreatment medium and at least one precoating agent, said pretreatment medium being selected from the group consisting of an alkaline pretreatment medium and an acidic pretreatment medium, and serving to clean, roughen and chemically activate the ceramic surface, and said at least one precoating agent is an adhesion promoter, a precursor thereof, or mixtures thereof and the adhesion promoter is copper oxide, the copper oxide is $Cu_2O$, and serves to precoat the ceramic surface;

immersing said ceramic substrate in the single pretreatment bath to simultaneously clean, roughen, chemically activate and precoat the ceramic substrate in a single step prior to wet metal-plating, said single step being conducted at a temperature higher than ambient temperature and in the absence of an external electric current;

removing the ceramic substrate from the single pretreatment bath; and placing the ceramic substrate within a wet metal-plating bath and wet metal-plating said ceramic substrate.

22. A process for treating a ceramic substrate preparatory to wet metal-plating, the process comprising the steps of:

providing a single treatment bath comprised of a pretreatment medium and at least one precoating agent, said pretreatment medium being selected from the group consisting of an alkaline pretreatment medium and an acidic pretreatment medium, and serving to clean, roughen and chemically activate the ceramic surface, and said at least one precoating agent being selected from the group consisting of an adhesion promoter, a sensitizer, an activator, and precursors thereof, and serving to precoat the ceramic surface;

immersing said ceramic substrate in the single pretreatment bath to simultaneously clean, roughen, chemically activate and precoat the ceramic substrate in a single step prior to wet metal-plating, said single step being conducted at a temperature higher than ambient temperature and in the absence of an external electric current and wherein in the pretreatment step:

the ceramic substrate is heated, the pretreatment medium is warmed or heated after application on the substrate, and the chemical activation of the substrate's surface is attained by one of hydrolysis, reduction-oxidation, complexing and precipitation reactions;

removing the ceramic substrate from the single pretreatment bath; and placing the ceramic substrate within a wet metal-plating bath and wet metal-plating said ceramic substrate.

23. A process for treating a ceramic substrate preparatory to wet metal-plating of copper, the process comprising the steps of:

providing a single pretreatment bath comprised of a pretreatment medium and at least one precoating agent, said pretreatment medium being selected from the group consisting of an alkaline pretreatment medium and an acidic pretreatment medium, and serving to clean, roughen and chemically activate the ceramic surface, and said at least one precoating agent being selected from the group consisting of an adhesion promoter, a sensitizer, an activator, and precursors thereof, and serving to precoat the ceramic surface;

immersing said ceramic substrate in the single pretreatment bath to simultaneously clean, roughen, chemically activate and precoat the ceramic substrate in a single step prior to wet copper-plating, said single step being conducted at a temperature higher than ambient temperature and in the absence of an external electric current;

removing the ceramic substrate from the single pretreatment bath; and placing the ceramic substrate within a wet copper-plating bath and wet copper-plating said ceramic substrate.

* * * * *